United States Patent
Hu et al.

(10) Patent No.: US 12,061,125 B2
(45) Date of Patent: Aug. 13, 2024

(54) TEMPERATURE SENSOR AND MEMORY DEVICE HAVING SAME

(71) Applicant: MACRONIX INTERNATIONAL CO., LTD., Hsinchu (TW)

(72) Inventors: Chia-Ming Hu, Hsinchu (TW); Chung-Kuang Chen, Hsinchu (TW); Chia-Ching Li, Hsinchu (TW); Chien-Fu Huang, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 958 days.

(21) Appl. No.: 17/011,864

(22) Filed: Sep. 3, 2020

(65) Prior Publication Data
US 2021/0325261 A1   Oct. 21, 2021

Related U.S. Application Data

(60) Provisional application No. 63/010,683, filed on Apr. 16, 2020.

(51) Int. Cl.
| | | |
|---|---|---|
| *G01K 7/42* | (2006.01) | |
| *H10B 43/40* | (2023.01) | |
| *H10B 51/40* | (2023.01) | |

(52) U.S. Cl.
CPC .............. *G01K 7/425* (2013.01); *H10B 43/40* (2023.02); *H10B 51/40* (2023.02)

(58) Field of Classification Search
None
See application file for complete search history.

(56) References Cited

U.S. PATENT DOCUMENTS

| | | |
|---|---|---|
| 5,784,328 A | 7/1998 | Irrinki et al. |
| 6,281,760 B1 | 8/2001 | Koelling et al. |
| 9,503,058 B1 | 11/2016 | Cical et al. |
| 9,696,213 B2 | 7/2017 | Sasaki et al. |
| 9,874,886 B2 | 1/2018 | Kim |
| 2007/0286259 A1 | 12/2007 | Kwon et al. |
| 2010/0046311 A1 | 2/2010 | Macerola et al. |

(Continued)

FOREIGN PATENT DOCUMENTS

| | | |
|---|---|---|
| JP | 2000048561 A | 2/2000 |
| WO | 2018217754 A1 | 11/2018 |
| WO | 2019036543 A1 | 2/2019 |

OTHER PUBLICATIONS

DiFederico et al., "Novel time-domain CMOS temperature sensor for passive RFID Tag," 2019 Argentine Conf on Electronics (CAE), Mar. 14-15, 2019, 4 pages.

*Primary Examiner* — Erica S Lin
(74) *Attorney, Agent, or Firm* — Andrew L. Dunlap; Haynes Beffel & Wolfeld LLP

(57) ABSTRACT

An integrated circuit includes a memory and peripheral circuits with a temperature sensor used to automatically adjust operating voltages. The temperature sensor includes a reference circuit that generates a first reference with a first non-zero temperature coefficient and a second reference with a second temperature coefficient having a different magnitude than the first non-zero temperature coefficient. A detector circuit on the integrated circuit, having temperature and process variation compensation, converts a difference between the first and second references into a digital signal indicating temperature on the integrated circuit.

13 Claims, 8 Drawing Sheets

(56) References Cited

U.S. PATENT DOCUMENTS

| | | | |
|---|---|---|---|
| 2015/0249428 A1* | 9/2015 | Huynh | G11C 16/10 331/66 |
| 2019/0226922 A1 | 7/2019 | Kim et al. | |
| 2020/0117147 A1* | 4/2020 | Mercier | H03M 1/50 |

\* cited by examiner

TEMPERATURE SENSOR AND MEMORY DEVICE HAVING SAME

PRIORITY APPLICATION

This application claims the benefit of U.S. Provisional Patent Application No. 63/010,683 filed 16 Apr. 2020, which application is incorporated herein by reference.

BACKGROUND

Field

The present invention relates to integrated circuits operated using voltages that are a function of temperature, and temperature sensors suitable for use on integrated circuits.

Description of Related Art

In many integrated circuits, including memory devices, the memory array cells in the circuit behave in a manner that is affected by chip temperature. It is desirable to provide circuitry suitable for implementation on integrated circuits to provide temperature information, and use this information to adjust voltages and other references applied to circuits on the integrated circuit, including as operating voltages for the memory array.

SUMMARY

To reduce the disadvantage of temperature effects on the memory operation, a temperature sensing component is provided on an integrated circuit memory system. The temperature sensing components are also suitable for other uses.

An integrated circuit is described which includes a memory and peripheral circuits used to automatically adjust operating voltages in dependence on output of a temperature sensor. The temperature sensor includes a reference circuit that generates a first reference with a first non-zero temperature coefficient and a second reference with a second temperature coefficient having a different magnitude than the first non-zero temperature coefficient, using first and second reference currents, wherein the second reference current can be a process-variation independent function of the first reference current, such as being proportional independent of process variation. A detector circuit on the integrated circuit, having temperature and process variation compensation, converts a difference between the first and second references into a digital signal indicating temperature on the integrated circuit.

An embodiment is described in which the detector comprises a timing generator including a circuit to pre-charge a capacitive node, and then discharge a voltage on the node, with a constant current, a comparator circuit that generates a first timing signal, when the voltage on the capacitive node matches the first reference, and generates a second timing signal when the voltage on the capacitive node matches the second reference, and a counter which counts a number of clock cycles of a clock signal between the first and second timing signals to produce the digital signal indicating temperature. An embodiment can include an oscillator that generates the clock signal having a clock period which is a function of the second reference current and the second reference. The oscillator can be a relaxation oscillator that alternately charges a capacitive node to a third reference having the second temperature coefficient, and discharges the capacitive node using a clock current having a magnitude proportional to the constant current.

An embodiment is described in which the detector includes a voltage divider to generate a set of comparator input voltages, the voltages in the set of comparator input voltages having magnitudes dependent on the second reference, and varying from a lower magnitude to a higher magnitude; and a set of comparators having parallel outputs, having first inputs having voltages set in dependence on the first reference and second inputs connected to respective comparator input voltages in the set of comparator input voltages. The parallel outputs of the set of comparators provide the digital signal indicating temperature.

A circuit is described herein that couples a temperature sensor output to peripheral circuits, a memory array, or both. With the temperature information, voltage bias and current bias can be applied in the peripheral circuits, memory array, or both that can compensate for or reduce the temperature effects on memory operations.

Other aspects and advantages of the present invention can be seen on review of the drawings, the detailed description and the claims, which follow.

BRIEF DESCRIPTION OF THE DRAWINGS

FIGS. 6, 7, and 8, combined, illustrate an embodiment of a temperature sensor as described herein, wherein FIG. 6 is a circuit diagram of a voltage reference generator generating voltages that vary with temperature and voltages that are constant across temperature.

FIG. 7 is a circuit diagram of a portion of a detector used with the reference generator of FIG. 7.

FIG. 8 is a circuit diagram of an oscillator having compensation for variations with temperature used with the circuit of FIGS. 6-8.

DETAILED DESCRIPTION

A detailed description of embodiments of the present invention is provided with reference to the FIGS. 1-13.

Figure 1:
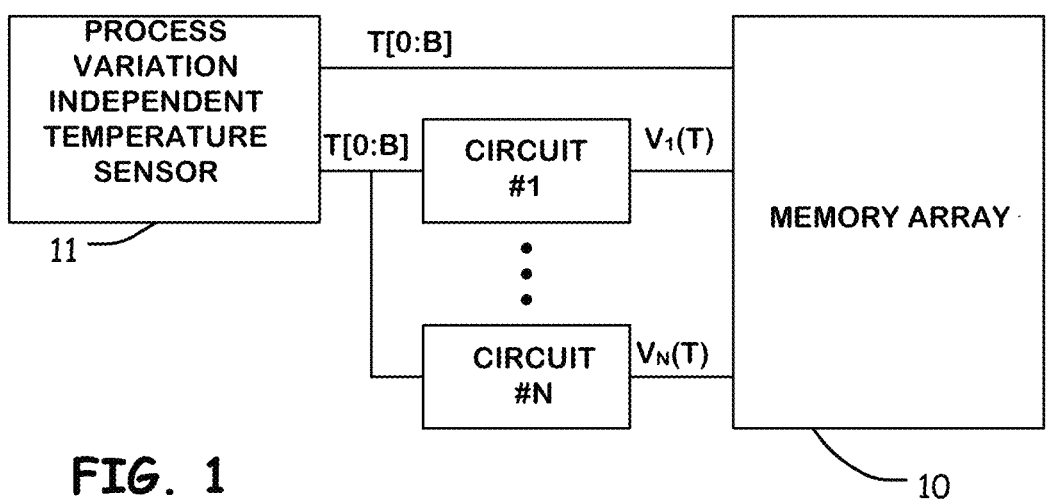
FIG. 1 is a simplified block diagram of an integrated circuit including a temperature sensor as described herein.

FIG. 1 is a block diagram of an integrated circuit memory device. The integrated circuit memory device includes a temperature sensor 11, a memory array 10 and peripheral circuits, including circuit #1, . . . circuit #N. The peripheral circuits generate voltages $V_1(T)$ to $V_N(T)$ that are controlled to vary as a function of temperature in response to the output of the temperature sensor 11. The output of the temperature sensor 11 is a digital signal T[0:B] which can be used by the peripheral circuits to control the magnitude of the voltages being generated. Also, in some embodiments, the temperature sensor can apply a signal to the memory array 10 directly. The memory array can, in some embodiments, be a nonvolatile memory. In some embodiments, the memory array is a flash memory.

Figure 2:
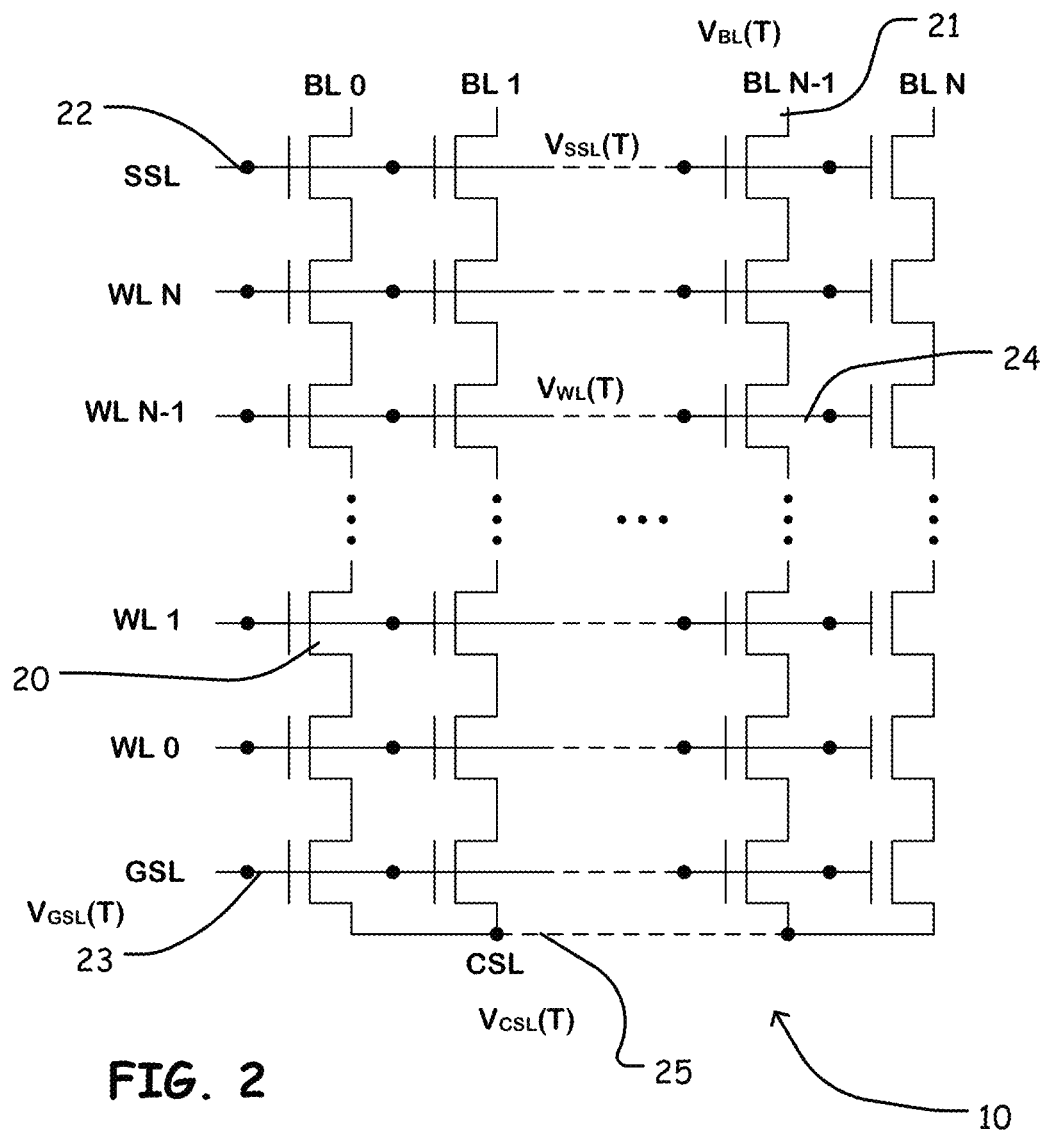
FIG. 2 is a simplified diagram of a NAND flash memory array suitable for use in the circuit of FIG. 1.

FIG. 2 is a schematic diagram of a NAND flash memory array which can be used as the array 10 in the circuit of FIG. 1. The NAND flash memory array includes a plurality of bit lines BL 0 to BL N, a plurality of word lines WL 0 to WL N, an upper string select line SSL and a lower string select line GSL. Memory cells (e.g. 20) are arranged in series along the bit lines to a common source line CSL, and have gates along respective word lines.

Peripheral circuits for array like that of FIG. 2 generate voltages as a function of the signal indicating temperature provided by the temperature sensor 11. For example, a voltage $V_{SSL}(T)$ can be applied to the SSL line 22 that is varied by the peripheral circuits as a function of temperature. A voltage VBL(T) can be applied to the bit line BL N-1 21 that is varied by the peripheral circuits as a function of temperature. A voltage $V_{WL}(T)$ can be applied to the word line WL N-1 24 that is varied by the peripheral circuits as a function of temperature. A voltage $V_{GSL}(T)$ can be applied to the GSL line 23 that is varied by the peripheral circuits as a function of temperature. A voltage $V_{CSL}(T)$ can be applied to the CSL line 25 that is varied by the peripheral circuits as a function of temperature. The various operating voltages for the memory array can be adjusted individually or in combination to establish optimized read windows or other performance measures such as program and erase speeds or efficiencies.

Figure 3:
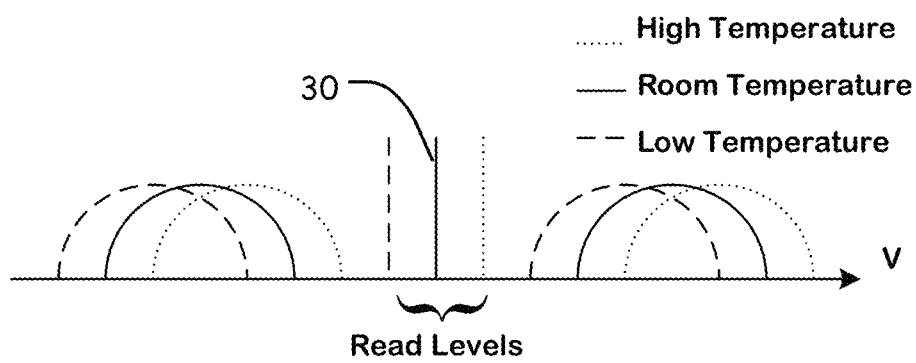
FIG. 3 illustrates operating voltages which can change the temperature in a memory array such as the memory of FIG. 2.

In operation, a NAND flash array like that of FIG. 2 can have operating characteristics that are a function of temperature. One example is illustrated in FIG. 3. FIG. 3 is a graph of the distribution of threshold voltages for memory cells in an erased state on the left side, and in a programmed state on the right side. As illustrated, in the erased state at high temperature, the threshold voltage distribution is shifted higher. At room temperature, the threshold voltage distribution for the erased state is at an intermediate level. At low temperature, the threshold voltage distribution is shifted lower. Likewise, in the programmed state at high temperature, the threshold voltage distribution is shifted higher. At room temperature, the threshold voltage distribution for the programmed state is at an intermediate level. At low temperature, the threshold voltage distribution is shifted lower.

Peripheral circuits as described herein are designed to automatically adjust a word line voltage read level 30 according to temperature so as to maintain read margin across the range of temperature for which the device is specified to operate. In a similar manner, the peripheral circuits can be configured to adjust other voltages in the array in order to maintain effective operation across the specified temperature range for a variety of memory operations, including program, erase, and read operations.

Figure 4:
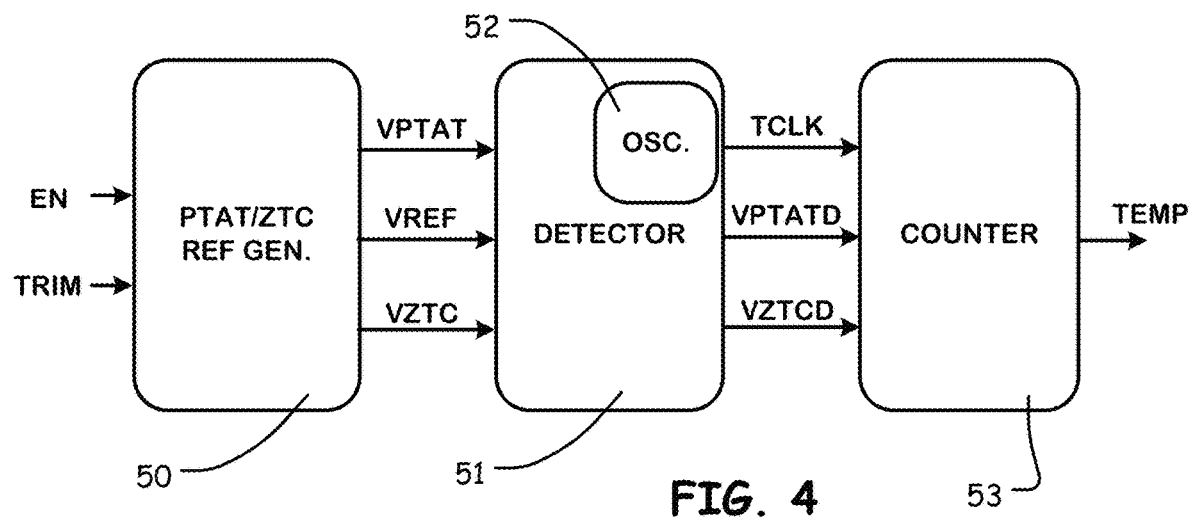
FIG. 4 is a simplified diagram of a temperature sensor according to embodiments of the present technology.

FIG. 4 is a simplified diagram of a temperature sensor configured for implementation on an integrated circuit. The temperature sensor includes a reference generator which generates a first voltage VPTAT that is proportional to absolute temperature, and a second voltage VZTC having a zero temperature coefficient, in that it is designed so that it tends to have a value does not change with temperature in the operating range of the circuit. This example it also generates a third voltage VREF having a zero temperature coefficient.

For the purposes of this description, a voltage is proportional to absolute temperature across the temperature range of the output of the temperature sensor. Likewise, a voltage has zero temperature coefficient across the temperature range of the output of the temperature sensor.

The inputs to the reference generator 50 include an enable signal EN and optionally a control signal TRIM that can be used to adjust components of the reference generator 50.

Figure 5:
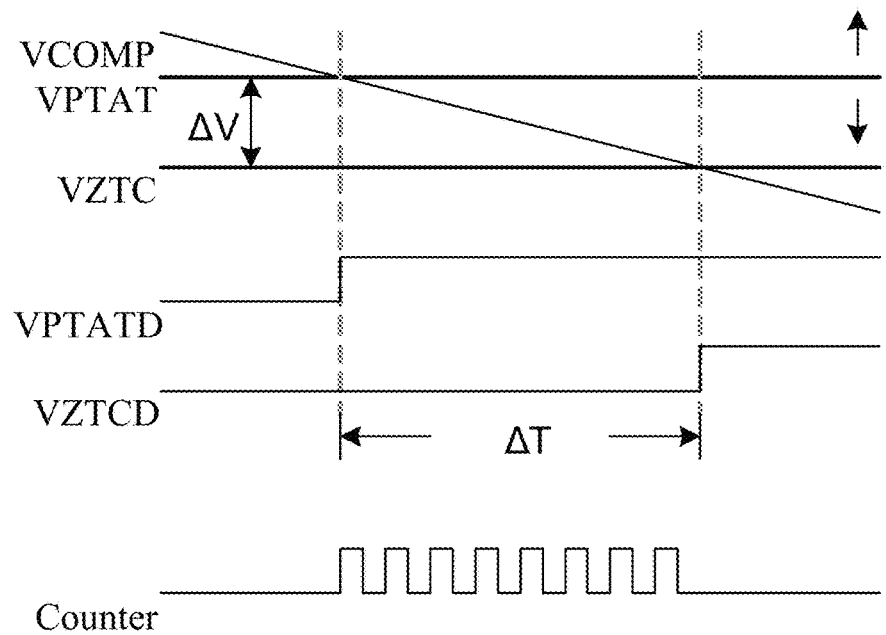
FIG. 5 is a timing diagram illustrating operation of one example of a temperature sensor like that of FIG. 4.

The outputs of the reference generator are applied to a detector stage 51, which includes an oscillator 52 in this example. The detector stage 51 reduces an output clock TCLK, a first timing signal VPTATD that indicates the timing of which the first reference voltage VPTAT crosses a threshold which is a function of VREF, and a second timing signal VZTCD which indicates the timing of which the second reference voltage VZTC crosses the threshold which is a function of VREF. The clock TCLK, the first timing signal VPTATD and second timing signal VZTCD are applied to a counter 53. The output of the counter 53 is a digital signal indicating the temperature of the integrated circuit at the temperature sensor FIG. 5 is a timing diagram illustrating operation of a circuit like that of FIG. 4. The timing diagram illustrates the voltage level VZTC of the second reference voltage, which is constant across the temperature range of the temperature sensor. Also, the first reference voltage VPTAT is illustrated, with the up and down arrows on the right side indicating that the level fluctuates with temperature. This results in a voltage difference ΔV as a function of temperature on the integrated circuit. The voltage VCOMP is the voltage on a capacitor that can be discharged at a constant rate, or can be provided using another voltage ramp generator circuit. In an embodiment, the voltage VCOMP is generated using a constant current IDISCH produced using current tracking so that the final counter output is produced by a circuit that compensates for process variations that may occur in manufacturing. As the voltage VCOMP drops, it will intersect with the voltage VPTAT. The time at which VCOMP intersects with VPTAT is indicated by toggling of the timing signal VPTATD. As the voltage VCOMP drops further, it will intersect with the voltage VZTC. The time at which VCOMP intersects with VZTC is indicated by toggling of the timing signal VZTCD.

The counter 53 is enabled by the toggling of the timing signal VPTATD and counts up at a constant rate in response to the clock TCLK. The counter is stopped by the toggling of the timing signal VZTCD after interval of time ΔT, which is a function of ΔV. The output of the counter is applied as a digital signal indicating temperature.

Figure 6:
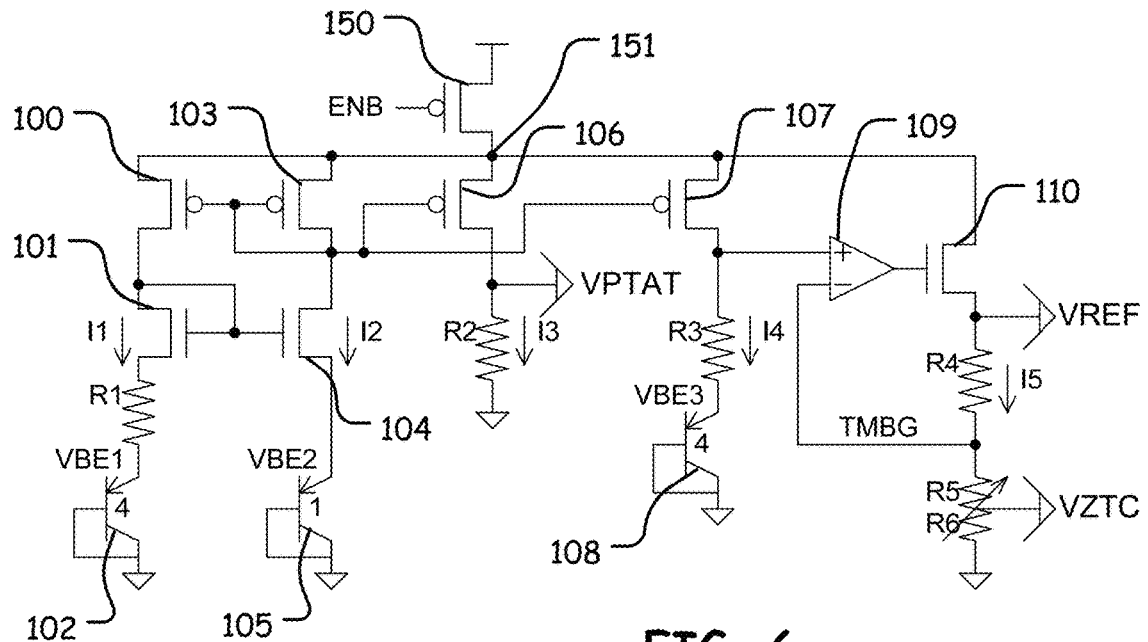

FIG. 6 is a circuit diagram of a reference circuit which can be formed on an integrated circuit, to generate a voltage proportional to absolute temperature VPTAT and a voltage having zero temperature coefficient VZTC.

The circuit includes a p-channel MOS transistor 150 connected between a supply terminal such as VDD, and node 151. The gate of transistor 150 is connected to an enable signal ENB active low in this example. When the enable signal ENB is low, power is applied to node 151 to drive the reference circuit.

P-channel MOS transistor 100 has one terminal connected to node 151, and a second terminal connected to n-channel MOS transistor 101. The gate and the drain of transistor 101 are connected together.

Transistor 101 has a second terminal connected to a resistor R1, which is in turn connected to bipolar transistor 102. Bipolar transistor 102 has its base connected to its collector, and its emitter connected to the reference VSS. A reference node VSS is typically connected to a DC ground. In other embodiments the reference node can be connected to AC ground or other DC voltage reference.

P-channel MOS transistor 103 has one terminal connected to node 151, and a second terminal connected to n-channel MOS transistor 104. The gate of transistor 104 is connected to the gate of transistor 103. Transistor 104 has a second terminal connected to a bipolar transistor 105. Bipolar transistor 105 has its base connected to its collector, and its emitter connected to the reference VSS. The gate of transistor 103 is connected to the drain of transistor 103, and to the gate of transistor 100. The bipolar transistors 102 and 105 have different sizes. In this example, transistor 102 has a base width that is four times that of transistor 105. Since transistors 100 and 103, and transistors 101 and 104 are connected in a current mirror relationship, the currents I1 and I2 through the transistors 102 and 105 are equal. Because the current densities are different, the base to emitter voltages VBE1 and VBE2 are also different. Therefore, the current I1 through transistor 102 is that current that generates a voltage drop across the resistor R1 that is equal to the difference between VBE1 and VBE2. This voltage drop should be proportional to absolute temperature.

The circuit includes p-channel MOS transistor 106 which is connected between node 151 and resistor R2. Transistor 106 has its gate connected to the gate of transistor 100 in a current mirror relationship. Resistor R2 is connected to a reference VSS. Because of the current mirror relationship, the current I3 through resistor R2 tracks the current I1, and generates the voltage VPTAT.

The circuit includes p-channel MOS transistor 107 connected between node 151, and a "+" input of an operational amplifier 109. Also, the input to the operational amplifier 109 is connected across resistor R3 and bipolar transistor 108 to VSS. Bipolar transistor 108 in this example is sized so that it is close to equal to the size of transistor 102, having a base four times the width of the base of transistor 105 in this example.

The circuit includes n-channel MOS transistor 110 connected between node 151, and a resistor R4. Resistor R4 is connected to a series combination of resistors R5 and R6, which are in turn connected to VSS. The node between resistor R4 and resistor R5 generates a voltage TMBG which is connected to the "−" input of the operational amplifier 109. The output of the operational amplifier drives the gate of transistor 110 in a manner that maintains the voltage VREF constant. A voltage having a zero temperature coefficient VZTC is provided at a node between resistors R5 and R6. The resistances of the transistors R5 and R6 can be tunable to set the desired level of the VZTC.

In this circuit, the following relationships are established:

$$I1=I2=I3=I4=(VBE2-VBE1)/R1=\Delta VBE21/R1$$

$$VPTAT=I3*R2=\Delta VBE21*(R2/R1)$$

$$TMBG=VBE3+I4*R3=VBE3+\Delta VBE21*(R3/R1)$$
$$=VBE3+(R3/R1)V_T \ln N$$

$$I5=TMBG/(R5+R6)$$

$$VREF=TMBG*(R4+R5+R6)/(R5+R6)$$

$$VZTC=TMBG*(R6/R5+R6)$$

As a result, the reference generator shown in FIG. 6 produces a voltage proportional to absolute temperature, and a voltage having zero temperature coefficient. More generally, the reference generator produces a first voltage VPTAT having a first temperature coefficient, and a second voltage VZTC having a second temperature coefficient. The magnitude of the first temperature coefficient is different than, and in this example greater than, the magnitude of the second temperature coefficient. As a result, the difference between the first voltage and second voltage is a function of temperature. In this example, the reference generator produces a third voltage VREF having a higher magnitude than the second voltage VZTC, and also having a zero or low magnitude temperature coefficient.

Figure 7:
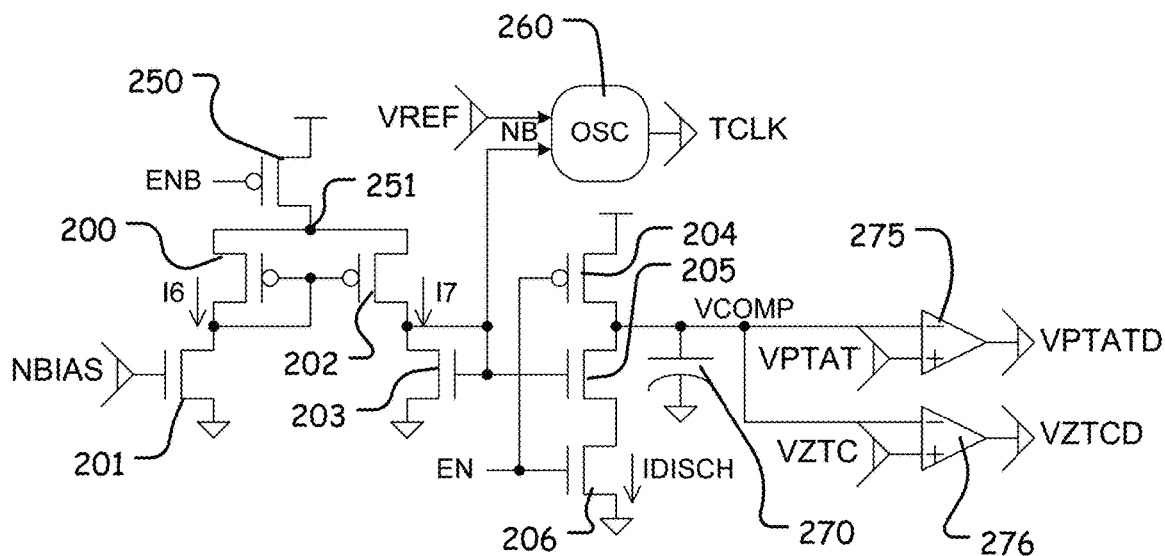

FIG. 7 is a circuit diagram of a detector/oscillator circuit like that used in the embodiment of FIG. 5. In this example, the circuit includes p-channel MOS transistor 250 connected between the supply voltage VDD and a node 251. The gate of transistor 250 is connected to the enable signal ENB, active low.

The circuit includes p-channel MOS transistor 200 connected in series with n-channel MOS transistor 201 between the node 251 and VSS. The gate of transistor 201 is connected to a bias voltage NBIAS. The drain and gate of transistor 200 are connected together.

The circuit includes p-channel MOS transistor 202 connected in series with n-channel MOS transistor 203 between the node 251 and VSS. The gate of transistor 202 is connected to the gate of transistor 200 in a current mirror fashion. The gate and drain of transistor 203 are connected together. The current I6 through transistor 201, and the current I7 through transistor 203 have magnitudes determined by the relative sizes of transistors 200 and 202. A voltage NB is produced of the gate of transistor 203.

The circuit includes an oscillator 260 which generates a clock signal TCLK. The inputs to the oscillator 260 illustrated in FIG. 7 include the bias voltage NB and the voltage VREF provided by the reference circuit of FIG. 6. In this manner, the clock TCLK generated by the oscillator 260. An implementation of the oscillator 260 is described with reference to FIG. 8.

The circuit in FIG. 7 includes p-channel MOS transistor 204 connected in series with n-channel transistor 205 and n-channel transistor 206 between the VDD and VSS. The gates of transistors 204 and 206 are connected to an enable signal EN, active high, which is complementary to the enable signal ENB.

The circuit includes capacitor 270 connected between the node between transistor 204 and transistor 205. The voltage VCOMP across the capacitor is applied to the "−" inputs of comparators 275 and 276. The "+" inputs of comparators 275 and 276 are connected to the voltages VPTAT and VZTC produced by the reference circuit of FIG. 6. The outputs of the comparators 275 and 276 are control signals VPTATD and VZTCD which indicate the timing at which the voltage VCOMP crosses the respective input voltage levels.

The current IDISCH through transistor 206 is driven to be a function of the current I7 through transistor 203 as a result of the connection of the gate of transistor 205 to bias voltage NB at the gate transistor 203.

In operation, when the signal EN is low, the capacitor 270 is charged to VDD. When the enable signal EN switches high, the capacitor 270 is discharged by the constant current IDISCH.

Figure 8:
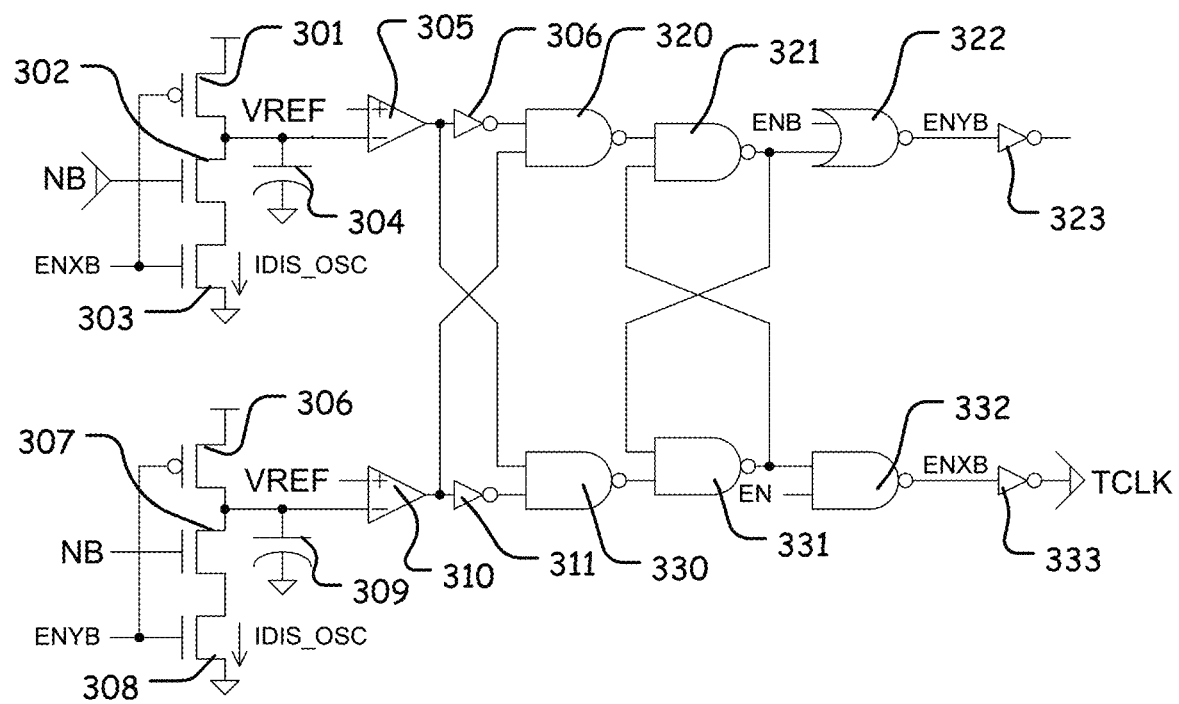

FIG. 8 is a circuit diagram for a relaxation oscillator, which can be used in the circuit of FIG. 7. It generates a clock signal TCLK having a clock rate that is proportional to, or otherwise a function of, the constant current IDISCH generated in the circuit of FIG. 7.

The circuit includes p-channel MOS transistor 301, n-channel MOS transistor 302, and n-channel MOS transistor 303 connected in series between VDD and VSS. The gates of transistors 301 and 303 are connected to feedback signal ENXB, active low. The gate of transistor 302 is connected to the bias voltage NB, as a result of which a current IDIS_OSC is generated through transistor 303 that is a function of the constant current IDISCH.

A capacitor 304 has a first terminal connected to the node between transistors 301 and 302, and a second terminal connected to VSS. The voltage on the first terminal of the capacitor is connected to the "−" input of comparator 305. The "+" input of the comparator 305 is connected to the voltage VREF produced by the reference circuit of FIG. 6. The output of the comparator 305 is applied to inverter 312, and as an input to NAND gate 330.

The circuit includes p-channel MOS transistor 306, n-channel MOS transistor 307, and n-channel MOS transistor 308 connected in series between VDD and VSS. The gates of transistors 306 and 308 are connected to feedback signal ENYB, active low. The gate of transistor 307 is connected to the bias voltage NB, as a result of which a current IDIS_OSC is generated through transistor 308 that is a function of the constant current IDISCH. In this example, IDIS_OSC in transistor 303 is about equal to the current in transistor 308.

A capacitor 309 has a first terminal connected to the node between transistors 306 and 307, and a second terminal connected to VSS. The voltage on the first terminal of the capacitor is connected to the "−" input of comparator 310. The "+" input of the comparator 310 is connected to the voltage VREF produced by the reference circuit of FIG. 6. The output of the comparator 310 is applied to inverter 311, and as an input to NAND gate 320.

The second input to the NAND gate 320 is the output of the inverter 312. The output of the NAND gate 320 is connected as an input to NAND gate 321. The second input to the NAND gate 330 is the output of the inverter 311. The output of the NAND gate 330 is connected as an input to the NAND gate 331.

The second input of the NAND gate 321 is the output of NAND gate 331. The second input of the NAND gate 331 is the output of the NAND gate 321.

The output of NAND gate 321 is also applied as an input to NOR gate 322. The second input to the NOR gate 322 is the enable signal ENB. The output of NAND gate 331 is also applied as an input to NAND gate 332. The second input to the NAND gate 332 is the enable signal ENB.

The output of the NAND gate 332 is the feedback signal ENXB. The output of the NOR gate 322 is the feedback signal ENYB.

The output of the NAND gate 332 is applied to inverter 333, the output of which is the clock signal TCLK in this embodiment. The output of the NOR gate 322 is also applied to inverter 323, in this example, the output of which can be used as a complement clock, or for other purposes.

In operation, when ENXB is low, the relaxation oscillator charges capacitor 304 to VDD. When ENXB is high, the capacitor 304 is discharged by the current IDIS_OSC until it reaches the reference voltage VREF. This triggers the logic to toggle ENXB low, and ENYB high. When ENYB is low, the relaxation oscillator charges the capacitor 309 to VDD. When ENYB is high, the capacitor 309 is discharged by the current IDIS_OSC until it reaches the reference voltage VREF. This triggers the logic to toggle ENXB high and ENYB low. This cycle alternates to produce the clock signal TCLK.

In this embodiment, the discharge current generated in the oscillator in response to NB, and the discharge current IDISCH in transistor 206 can be proportional to one another. Thus, the ratio of change in temperature to the period of the clock signal TCLK will be independent of process variations, at least across process corners encountered in typical fabrication lines. So, process variations in process that affect the operation of the MOS transistors, the current and the capacitance to do not result in inaccurate temperature sensing.

Figure 9:
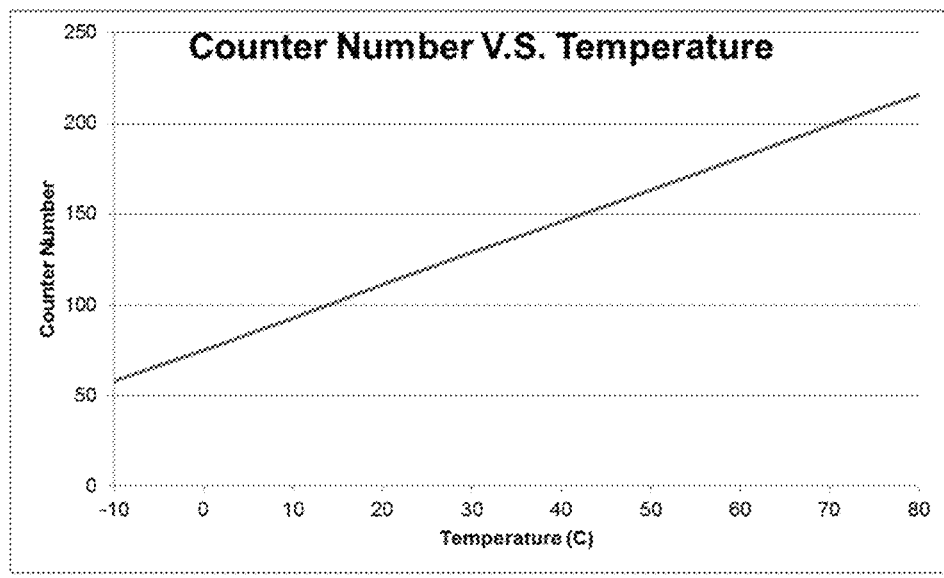
FIG. 9 illustrates results of simulation of the digital output of a counter versus temperature of a circuit implemented using the technology of FIGS. 6-8.

In the circuit of FIGS. 7 to 9, only one counter is utilized, and no divider is required. Thus, it can be implemented using less chip area, less current and less calculation time than embodiments that use a technique like that described with reference to FIG. 4.

FIG. 9 is a graph showing results of simulation of operation of a temperature sensor like that shown in FIGS. 7-9. Operating over a range of −10° C. to +80° C., the simulation illustrates a linear increase of counter output across the range.

Figure 10:
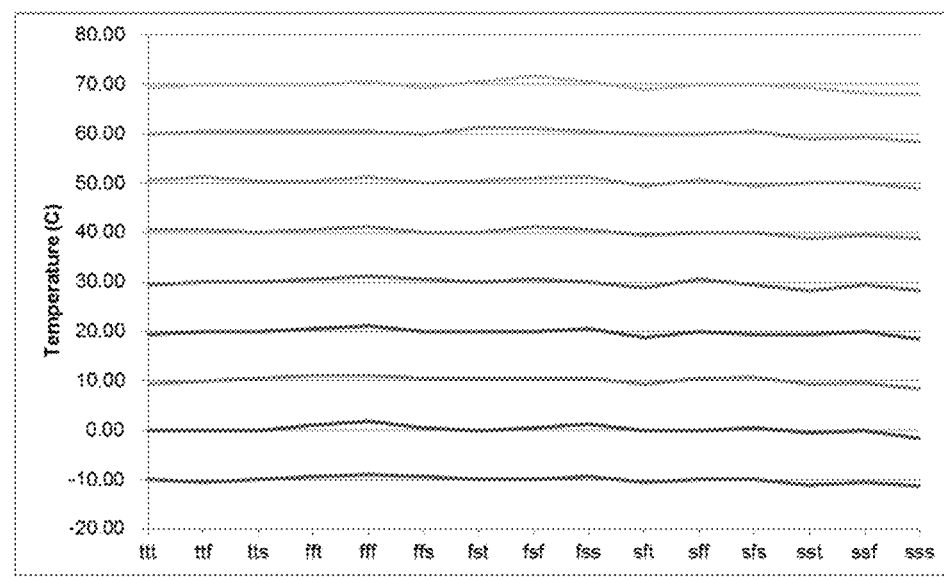
FIG. 10 illustrates simulation of variations with process corner versus temperature for a circuit using the technology of FIGS. 6-8.

FIG. 10 illustrates additional simulation results across process corners for the circuit shown in FIGS. 7-9 across the operating range from −10° C. to +70° C. According to the simulation, across process variation, the variation in temperature output is about plus or minus 2° C. across a temperature range from −10° C. to +70° C.

Figure 11:
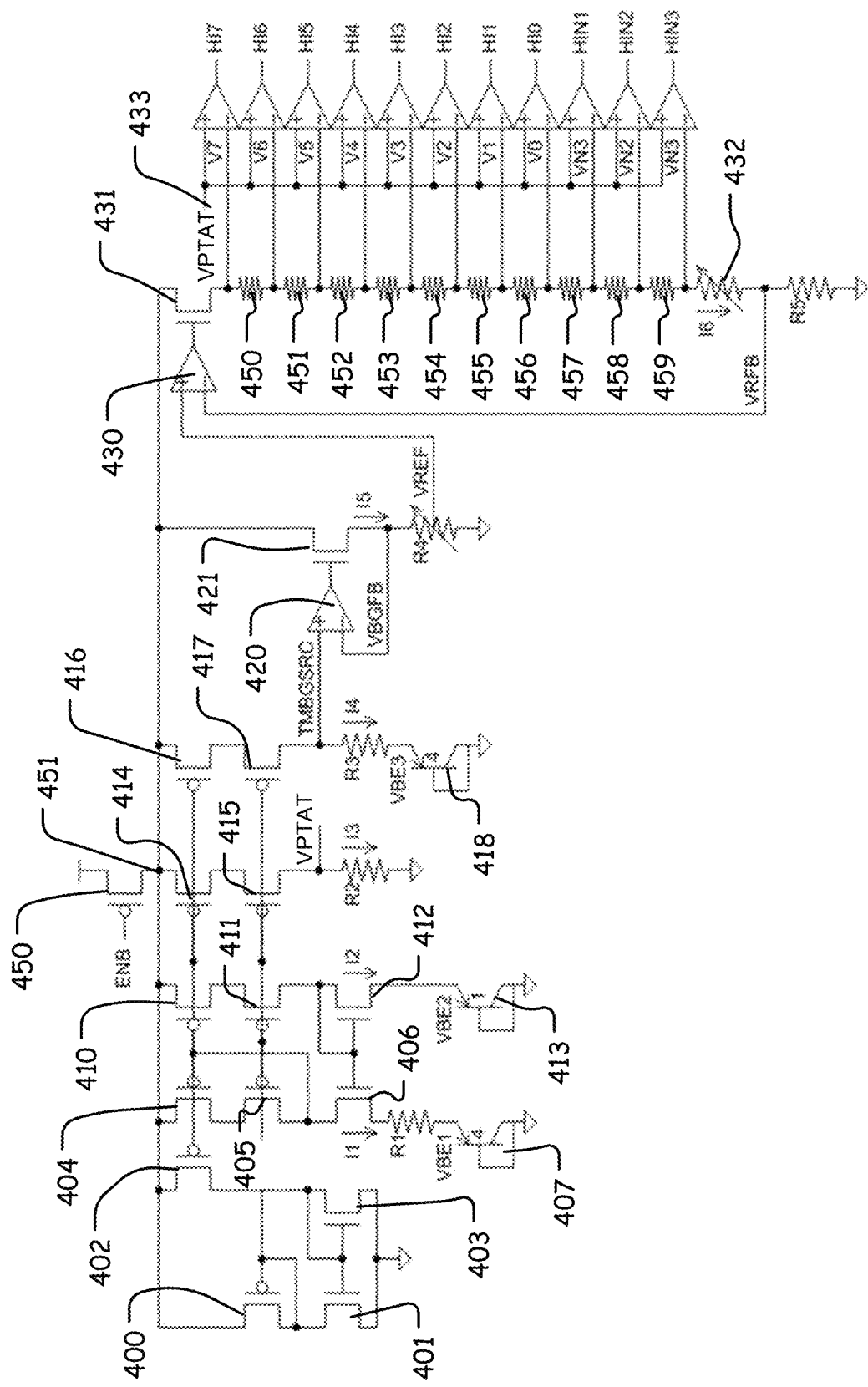
FIG. 11 is a circuit diagram of an alternative embodiment of a temperature sensor, generating a parallel digital output, and having temperature compensation as described herein.

FIG. 11 is a circuit diagram of an alternative embodiment of a temperature sensor, which provides all digital output indicating temperature of an integrated circuit on which it is disposed. The circuit includes a reference generator providing a voltage VPTAT that is proportional to temperature, and a second voltage VREF that has zero temperature coefficient. More generally, the reference generator produces a first voltage VPTAT having a first temperature coefficient, and a second voltage VREF having a second temperature coefficient. The magnitude of the first temperature coefficient is different than the magnitude of the second temperature coefficient. As a result, the difference between the first voltage and second voltage is a function of temperature.

Also, the circuit includes a detector having temperature compensation based on the second reference, to convert a difference between the first and second references into a digital signal indicating temperature on the integrated circuit.

The circuit includes a p-channel MOS transistor 450 connected between the supply VDD and a node 451. The gate of the transistor 450 is connected to receive an enable signal ENB, active low, and applies power to node 451 when ENB is low.

The circuit includes p-channel MOS transistor 400 connected in series with n-channel MOS transistor 401 between node 451 and VSS. Also, the circuit includes p-channel MOS transistor 402 connected in series with n-channel MOS transistor 403 between node 451 and VSS. The gates of transistors 401 and 403 are connected together, and to the drain of transistor 403. Also, the gate of transistor 400 is connected to its drain, and to the drain of transistor 403.

The circuit includes p-channel MOS transistor 404 connected in series with p-channel MOS transistor 405, n-channel MOS transistor 406, resistor R1, and bipolar transistor 407 between the node 451 and VSS. Also, p-channel MOS transistor 410 is connected in series with p-channel MOS transistor 411, n-channel MOS transistor 412, and bipolar transistor 413. Bipolar transistor 407 has a base width four times greater than that of bipolar transistor 413 in this example. The gates of transistors 406 and 412 are connected together, and to the drain of transistor 412. The gates of transistors 405 and 411 are connected together. The gates of transistors 404 and 410 connected together, and to the node between transistors 405 and 406. A current I1 and a current I2 are generated as a function of the difference in VBE1 and VBE2 and the resistance R1.

A p-channel MOS transistor 414 is connected in series with p-channel MOS transistor 415 and resistor R2, between node 451 and VSS. The voltage VPTAT is generated at the node between transistor 415 and resistor R2.

A p-channel MOS transistor 416 is connected in series with p-channel MOS transistor 417, resistor R3, and bipolar transistor 418 between node 451 and VSS. The bipolar transistor 418 is sized with a base width equal to that of bipolar transistor 407 in this example. The voltage TMBGSRC is generated at the node between transistor 417, and the resistor R3. This node is connected as the "+" input to operational amplifier 420.

The circuit includes n-channel MOS transistor 421, connected in series with a tunable resistor divider R4 between node 451 and VSS. The node between resistor divider R4 and transistor 421, is also connected to the "−" input of operational amplifier 430. A voltage VREF is generated at a node in the resistor divider R4, which is applied as the "+" input to operational amplifier 430.

The circuit includes n-channel MOS transistor 431, connected in series with a resistor ladder, tunable resistor 432, and resistor R5 between node 451 and VSS. The resistor ladder includes resistors 450 to 459 connected in series between the transistor 431 and the tunable resistor 432, tapped with contacts between the resistors. The voltage VRFB on the node between resistor R5 and the tunable resistor 432 is fed back to the "−" input of the operational amplifier 430.

The tunable resistor 432 in the tunable resistor divider R4 can be trimmed for the purposes of calibration or other operating characteristics of the device.

The resistor ladder produces voltages VN3, VN2, VN1, V0, V1, . . . V7 at the taps between adjacent resistors in the series connected resistors 450 to 459, in this example as a function of the reference VREF which has a zero temperature coefficient. The circuit includes a set of comparators having inputs connected to respective ones of the voltages produced by the resistor ladder, and providing outputs HIN3, HIN2, HIN1, HI0, HI1, HI7 in this example. The "+" inputs of all of the comparators in the set of comparators receives the reference voltage VPTAT on line 433. In the illustrated example, the outputs HIN3, HIN2, HIN1, HI0, HI1, . . . HI7 are a digital signal indicating temperature, and are generated in parallel. The output HIN3 indicates that the voltage is greater than −30° for example. HIN2 indicates greater than −20°. HIN1 indicates greater than −10°. HI0 indicates greater than 0°, and so on until signal HI7 indicates a temperature greater than 70°.

In the circuit, the signal VPTAT will vary with temperature. The signals TMBGSRC, VBGFB, VREF, VN[3:1] and V[7:0] will have a zero temperature coefficient or otherwise lower temperature coefficient than VPTAT. The resistance ratio of the resistor ladder is adjusted so that the voltage VPTAT is equal to the data voltage at the corresponding temperatures.

In this circuit, assuming uniform transistor sizes in the mirror transistors, the following relationships are established:

$$I1=I2=I3=I4=(VBE2-VBE1)/R1=\Delta VBE21/R1$$

$$VPTAT=I3*R2=\Delta VBE21*(R2/R1)$$

$$TMBGSRC=VBE3+I4*R3=VRE3+\Delta VBE21*(R3/R1)=VBE3+(R3/R1)V_T lnN$$

$$I5=TMBGSRC/R4$$

$$I6=VREF/R5$$

Figure 12:
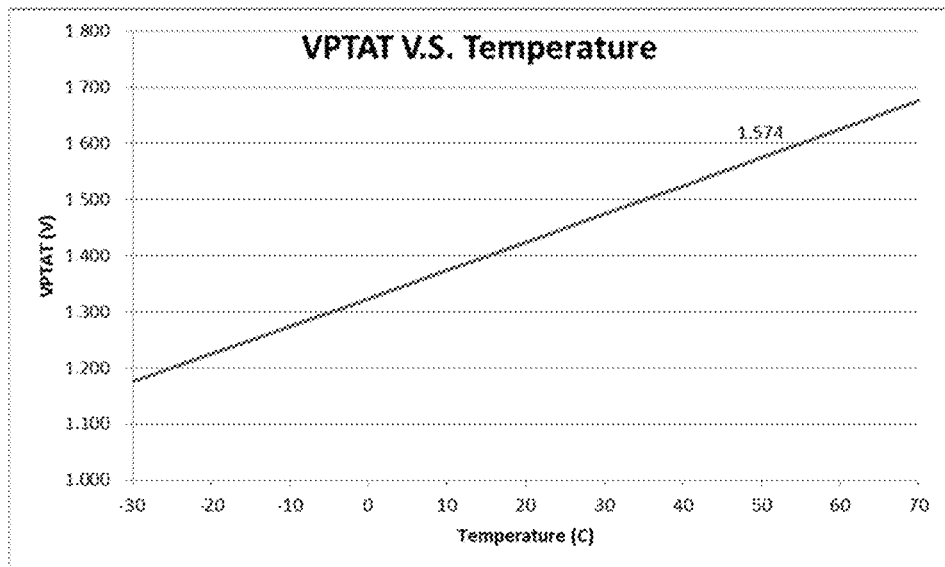
FIG. 12 illustrates results of simulation of the reference voltage VPTAT over temperature for a circuit like that of FIG. 11.

FIG. 12 illustrates results of simulation of the circuit of FIG. 11. As seen, the simulation shows that the voltage VPTAT increases with temperature linearly across the temperature range −30 to +70° C. For example, when the voltage VPTAT is about 1.574 V in this simulation, it indicates a temperature of about 50°. The resistor ladder of FIG. 11 is adjusted so that the "−" input VN5 to the comparator has a voltage causing the signal HI5 to toggle when VPTAT reaches 1.574 volts.

Figure 13:
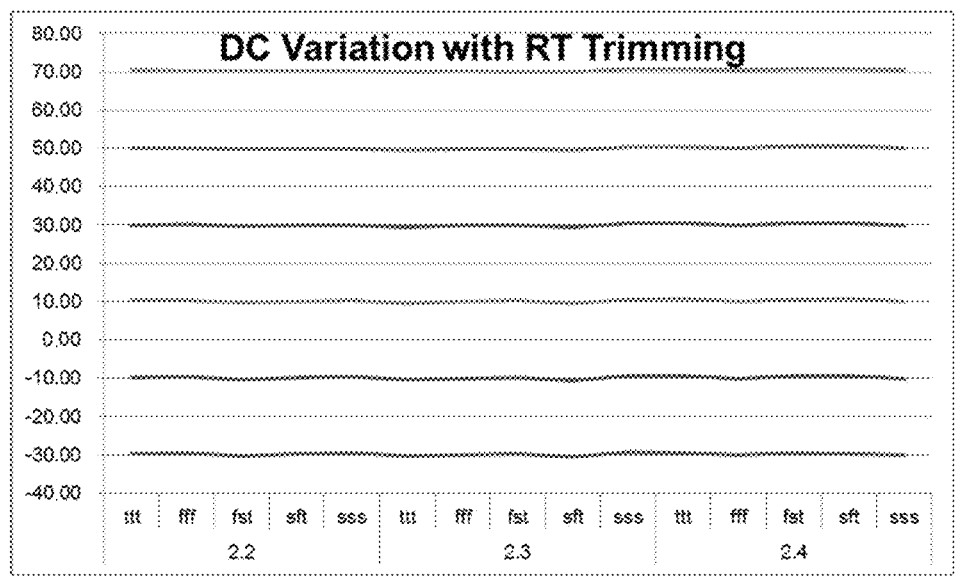
FIG. 13 illustrates simulation of variations with process corner versus temperature for a circuit like that of FIG. 11.

FIG. 13 is a graph showing simulation results of the circuit of FIG. 11 across process corners. As illustrated, variation of plus or minus 2° C. is established within the range of −30° C. to +70° C.

The circuit shown in FIG. 11 does not require an oscillator, a counter or a digital divider. Therefore, it can be implemented in a smaller layout area, and can have a faster setup time than other temperature sensors. The circuit in FIG. 11 is process variation tolerant because the currents used to generate the PTAT voltage VPTAT and the zero temperature coefficient voltage TMBGSRC are proportional independent of process, at least across process corners encountered in typical fabrication lines.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
 a memory and peripheral circuits operatively coupled to the memory which apply an operating voltage to the memory,
 wherein the peripheral circuits include:
  a reference circuit on an integrated circuit chip that generates a first reference with a first non-zero temperature coefficient and a second reference with a second temperature coefficient having a different magnitude than the first non-zero temperature coefficient;
  a detector circuit on the integrated circuit having temperature compensation based on the second reference, and used to convert a difference between the first and second references into a digital signal indicating temperature on the integrated circuit; and
  bias circuitry responsive to the digital signal to provide an adjusted operating voltage to compensate for temperature changes.

2. The integrated circuit of claim 1, wherein the first reference is a voltage proportional to absolute temperature VPTAT.

3. The integrated circuit of claim 1, wherein the second reference is voltage having a zero temperature coefficient VZTC.

4. The integrated circuit of claim 1, wherein the detector circuit comprises:
   a timing generator including a circuit to pre-charge a capacitive node, and then discharge a voltage on the capacitive node with a constant current;
   a comparator circuit that generates a first timing signal when the voltage on the capacitive node matches the first reference, and generates a second timing signal when the voltage on the capacitive node matches the second reference; and
   a counter which counts a number of clock cycles of a clock signal between the first and second timing signals to produce the digital signal indicating temperature.

5. The integrated circuit of claim 4, including an oscillator that generates the clock signal, the oscillator having a clock period which is a function of the constant current and the second reference.

6. The integrated circuit of claim 5, wherein the oscillator is a relaxation oscillator that alternately charges a capacitive node to a third reference having the second temperature coefficient, and discharges the capacitive node using a clock current having a magnitude proportional to the constant current.

7. The integrated circuit of claim 1, wherein the detector circuit comprises:
   a voltage divider to generate a set of comparator input voltages, the voltages in the set of comparator input voltages having magnitudes dependent on the second reference, and varying from a lower magnitude to a higher magnitude; and
   a set of comparators having parallel outputs, having first inputs having voltages set in dependence on the first reference and second inputs connected to respective comparator input voltages in the set of comparator input voltages;
      wherein the parallel outputs of the set of comparators provide the digital signal indicating temperature.

8. The integrated circuit of claim 1, wherein the adjusted operating voltage is a word line voltage.

9. The integrated circuit of claim 1, wherein the adjusted operating voltage is a bit line voltage.

10. The integrated circuit of claim 1, wherein the adjusted operating voltage is a source line voltage.

11. The integrated circuit of claim 1, wherein the memory includes a NAND array, and the adjusted operating voltage is a string select line voltage.

12. The integrated circuit of claim 1, wherein the memory is a non-volatile memory.

13. The integrated circuit of claim 1, wherein the reference circuit generates the first reference using a first reference current and generates the second reference using a second reference current that is proportional to the first reference current independent of temperature.

* * * * *